United States Patent
Schreier et al.

(10) Patent No.: US 7,358,879 B2
(45) Date of Patent: Apr. 15, 2008

(54) ΔΣ MODULATOR SYSTEM WITH START UP TRANSIENT SUPPRESSION

(75) Inventors: Richard Schreier, Andover, MA (US); Nazmy Abaskharoun, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/493,415

(22) Filed: Jul. 26, 2006

(65) Prior Publication Data

US 2007/0035429 A1   Feb. 15, 2007

Related U.S. Application Data

(60) Provisional application No. 60/706,671, filed on Aug. 9, 2005, provisional application No. 60/706,670, filed on Aug. 9, 2005.

(51) Int. Cl.
  *H03M 3/00*   (2006.01)
(52) U.S. Cl. ............... 341/143; 341/139; 341/155
(58) Field of Classification Search ............... 341/139
  See application file for complete search history.

(56) References Cited

U.S. PATENT DOCUMENTS

| | | | | |
|---|---|---|---|---|
| 4,494,212 A | * | 1/1985 | Muellner | 702/107 |
| 4,500,845 A | * | 2/1985 | Ehni | 330/86 |
| 4,851,841 A | * | 7/1989 | Sooch | 341/143 |
| 5,012,244 A | * | 4/1991 | Wellard et al. | 341/143 |
| 6,064,326 A | * | 5/2000 | Krone et al. | 341/143 |
| 6,292,120 B1 | * | 9/2001 | Painchaud et al. | 341/139 |
| 6,362,763 B1 | * | 3/2002 | Wang | 341/143 |
| 6,445,732 B1 | * | 9/2002 | Beamish et al. | 375/224 |
| 6,567,025 B2 | * | 5/2003 | Schreier et al. | 341/143 |
| 6,657,570 B1 | * | 12/2003 | Chiappetta | 341/120 |
| 6,680,640 B1 | * | 1/2004 | Behzad | 327/308 |
| 6,765,520 B1 | * | 7/2004 | Chuang et al. | 341/143 |
| 6,768,436 B1 | * | 7/2004 | Chuang | 341/143 |
| 6,847,318 B2 | * | 1/2005 | Leenen | 341/118 |
| 6,963,733 B2 | * | 11/2005 | Eriksson et al. | 455/132 |
| 7,053,807 B1 | * | 5/2006 | Gaalaas | 341/143 |
| 7,135,942 B2 | * | 11/2006 | Westra et al. | 333/81 R |
| 2004/0080439 A1 | * | 4/2004 | Van Der Mee | 341/139 |

OTHER PUBLICATIONS

Dorrer et al., *A 3-mW 74-db SNR 2-MHz Continuous-Time Delta-Sigma ADC with a Tracking ADC Quantizer in 0/13-um CMOS*, IEEE Journal of Solid-State Circuits, vol. 40, No. 12 Dec. 2005, pp. 2416-2416.

Chao et al. *A Higher Order Topology for Interpolative Modulators for Oversampling A/D Converters*, IEEE Transactions on Circuits and Systems, vol. 37, No. 3, Mar. 1990, pp. 309-318.

Richard Schreier, *Delta Sigma Toolbox*, Version 5.2, Jun. 7, 2000, pp. 1-25.

* cited by examiner

*Primary Examiner*—Khai M Nguyen
(74) *Attorney, Agent, or Firm*—Iandiorio Teska & Coleman

(57) ABSTRACT

A ΔΣ modulator system with start up transient suppression includes a ΔΣ analog to digital converter having predetermined internal signal limits; an envelope control circuit for attenuating the input signal to the ΔΣ analog to digital converter and a control circuit responsive to a start/reset signal to enable for a limited time the envelope control circuit to attenuate the input signal to maintain the ΔΣ analog to digital converter internal signal substantially within the predetermined internal signal limits.

9 Claims, 6 Drawing Sheets

ΔΣ MODULATOR SYSTEM WITH START UP TRANSIENT SUPPRESSION

RELATED APPLICATIONS

This application claims benefit of U.S. Provisional Application Ser. No. 60/706,671 filed Aug. 9, 2005 and U.S. Provisional Application Ser. No. 60/706,670 filed Aug. 9, 2005. This application is incorporated herein by this reference.

FIELD OF THE INVENTION

This invention relates to a ΔΣ modulator system with startup transient suppression.

BACKGROUND OF THE INVENTION

Delta-sigma (ΔΣ) analog to digital converters (ADCs) are increasingly used for high-fidelity conversion of analog signals into digital form. One of the drawbacks of a ΔΣ converter is that it can be placed in an improper operating condition by out-of-range signals or as a result of startup transients, and thus requires a mechanism to return it to proper operation upon overload and at startup. A typical implementation of this mechanism is to reset the internal states of the system, i.e. to discharge all state-storing capacitors in the loop filter. For many modulators, this state reset is sufficient.

Feedforward modulators, however are less tolerant of a simple reset. FIG. 1 plots the output of the first integrator in a third-order feedforward modulator which starts from an initial state of zero when a moderately large dc input is present. As indicated, the first integrator's output exhibits larger excursions at startup than when the modulator has achieved steady-state. Requiring the integrator to accommodate the much larger transient response would worsen the ADC's power consumption or degrade its dynamic range, while an inability to accommodate the transient response may cause the modulator to behave improperly and lead to repeated reset events.

These transients which can occur with abrupt startups or resets can cause unusually large signal swings that exceed normal operating conditions. In computer simulations the input signals are tailored to avoid these events but in a practical implementation they remain a problem. Automatic Gain Control (AGC's) circuits can regulate input in response to output excursions beyond predetermined limits, but only after the fact: AGC's cannot, for example, anticipate and react to startup/reset transients.

SUMMARY OF THE INVENTION

It is therefore an object of this invention to provide an improved ΔΣ modulator system with startup transient suppression.

It is a further object of this invention to provide an improved ΔΣ modulator system with startup transient suppression which allows the modulator to enter a proper operating state for larger inputs than can be otherwise tolerated.

It is a further object of this invention to provide an improved ΔΣ modulator system with startup transient suppression which suppresses transients.

It is a further object of this invention to provide an improved ΔΣ modulator system with startup transient suppression which can recover from start/reset even if a large signal is present.

It is a further object of this invention to provide an improved ΔΣ modulator system with startup transient suppression which allows a ΔΣ modulator to be designed such that it only accommodates the steady-state swing.

It is a further object of this invention to provide an improved ΔΣ modulator system with startup transient suppression which saves power, reduces die area and increases performance.

The invention results from the realization that an improved ΔΣ modulator system with startup transient suppression can be achieved with a control circuit which is responsive to a start/reset signal to enable for a limited time an envelope control circuit to attenuate the input signal in order to maintain the ΔΣ analog to digital converter internal signal substantially within predetermined internal signal limits of the analog to digital converter.

The subject invention, however, in other embodiments, need not achieve all these objectives and the claims hereof should not be limited to structures or methods capable of achieving these objectives.

This invention features a ΔΣ modulator system with start-up transient suppression. There is a ΔΣ analog to digital converter having predetermined internal signal limits and an envelope control circuit for attenuating the input signal to the ΔΣ analog to digital converter. The control circuit is responsive to a start/reset signal to enable for a limited time the envelope control circuit to attenuate the input signal to maintain the ΔΣ analog to digital converter internal signal substantially within the predetermined internal signal limits.

In preferred embodiment the envelope control circuit may include a programmable attenuator. The programmable attenuator may include a switched resistor network. The ΔΣ analog to digital converter may be a current input analog to digital converter and the resistor network may include series input resistors interconnected to the analog to digital converter. The control circuit may include a counter for defining a limited time. There may be an overload detector circuit for detecting an internal signal substantially beyond the predetermined internal signal limits to deliver a start/reset signal to the control circuit. The analog to digital converter may include a loop filter having a plurality of feedforward integrator stages. The envelope circuit may attenuate the input signal along a predetermined profile. The limited time may be a fixed limited time.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
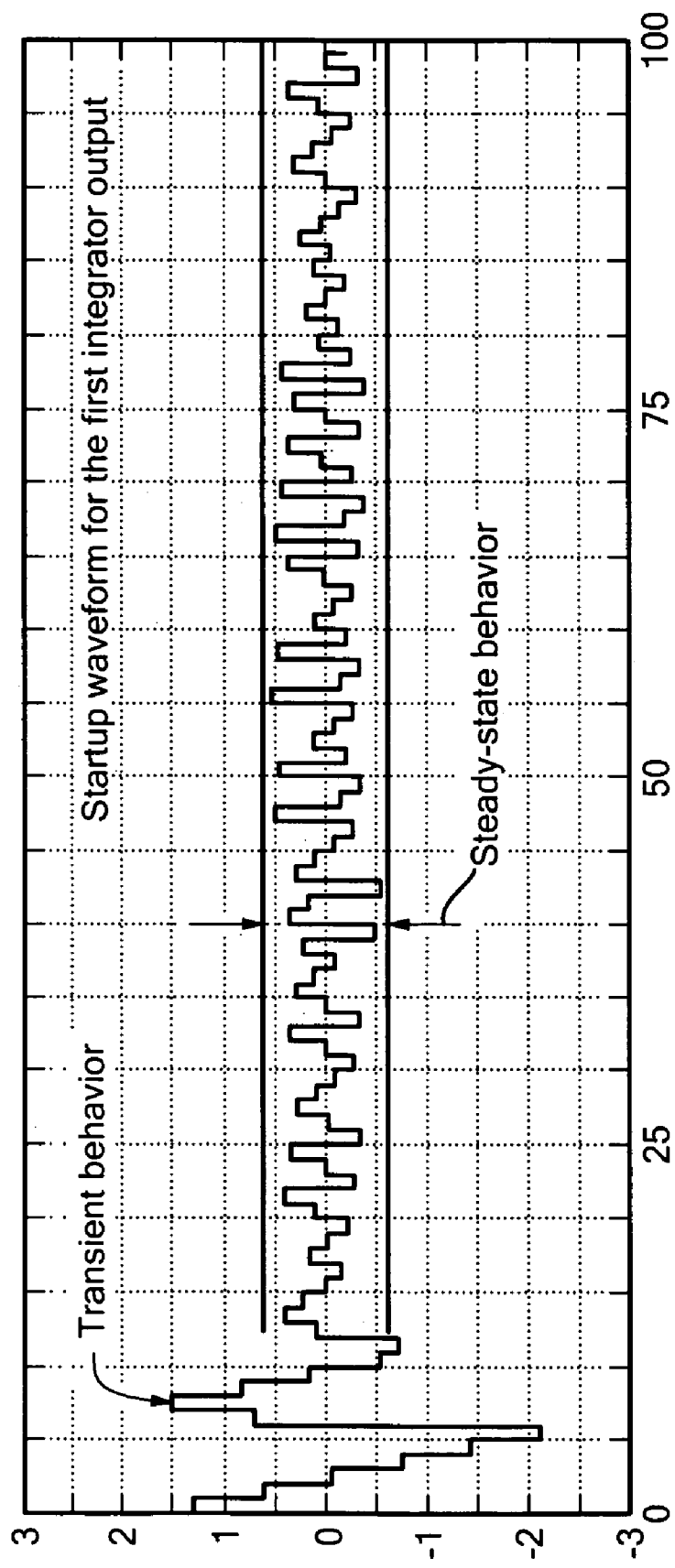
FIG. 1 illustrates the startup waveform for the first integrator output of a prior art ΔΣ analog to digital converter.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 2:
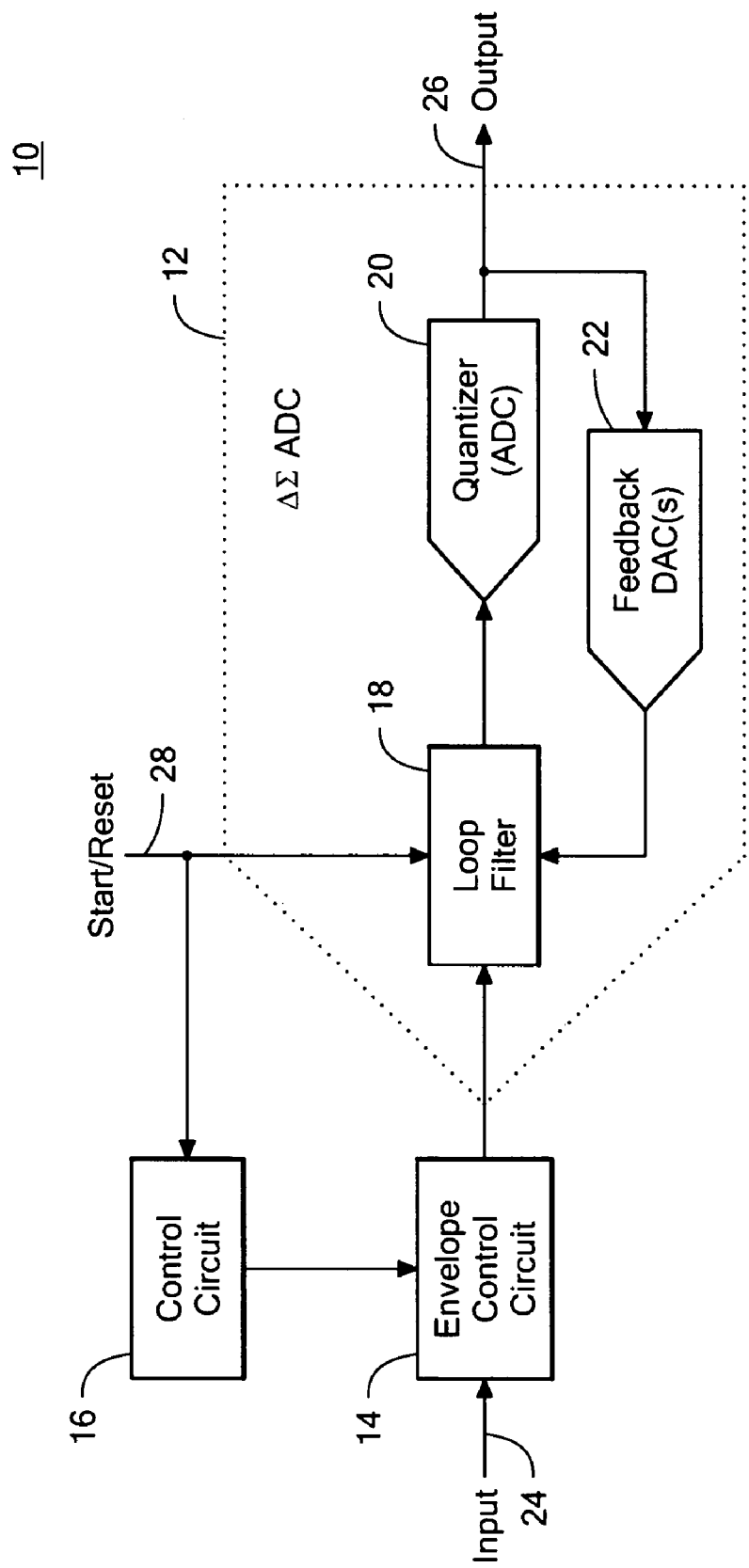
FIG. 2 is a schematic block diagram of an improved ΔΣ modulator system with startup transient suppression according to this invention.

There is shown in FIG. 2 a $\Delta\Sigma$ modulator system 10 with start-up transient suppression including a $\Delta\Sigma$ analog to digital converter 12 an envelope control circuit 14 and a control circuit 16. $\Delta\Sigma$ analog to digital converter 12 includes loop filter 18 quantizer or analog to digital converter 20 and a feed back loop including digital to analog converter 22. The input 24 for analog to digital converter 12 must first pass through envelope control circuit 14. The output of analog to digital converter 12 is provided at output 26.

Figure 3:
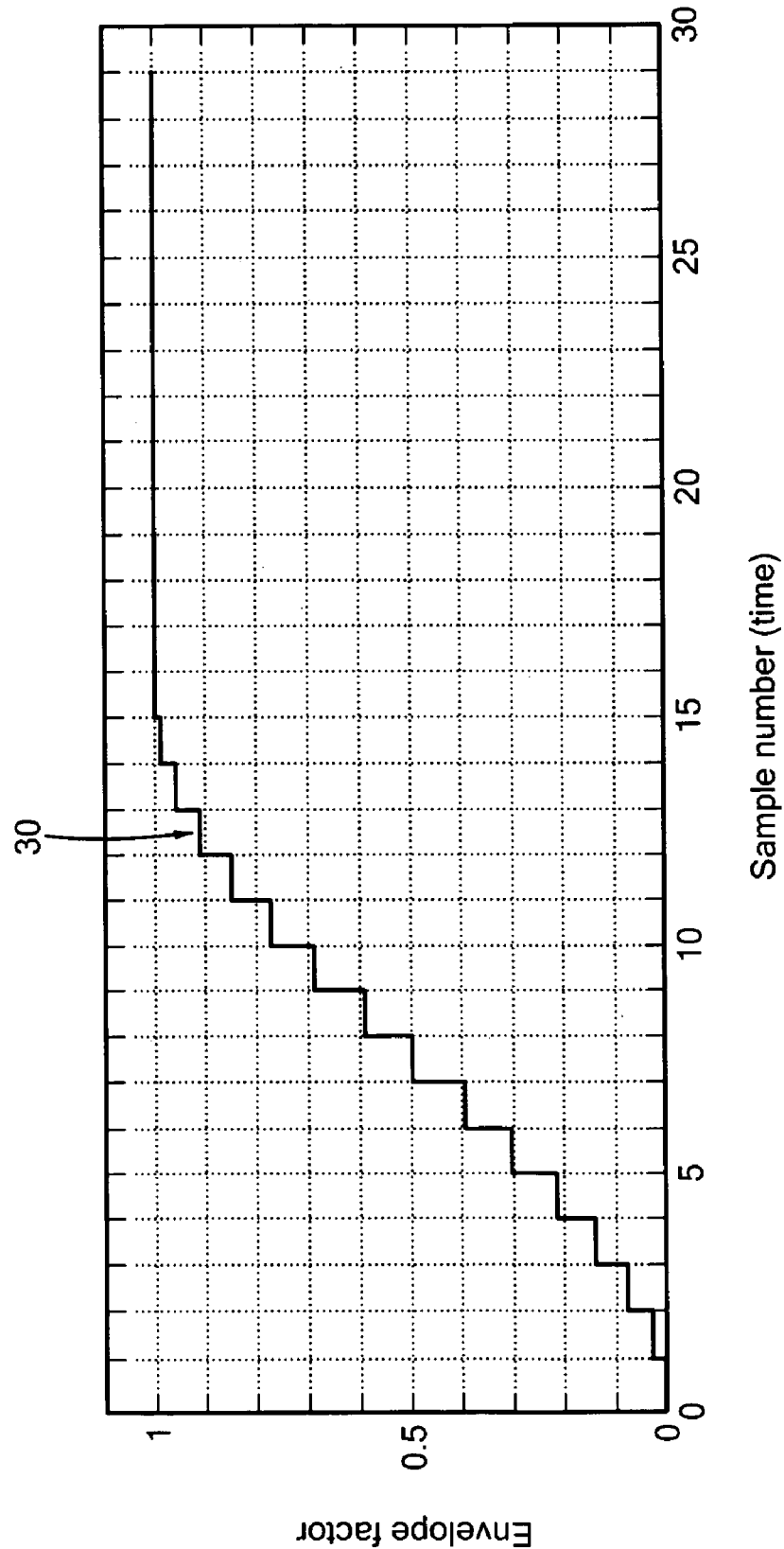
FIG. 3 is an illustration of the envelope profile obtainable with the improved ΔΣ modulator system with startup transient suppression of this invention.
Figure 4:
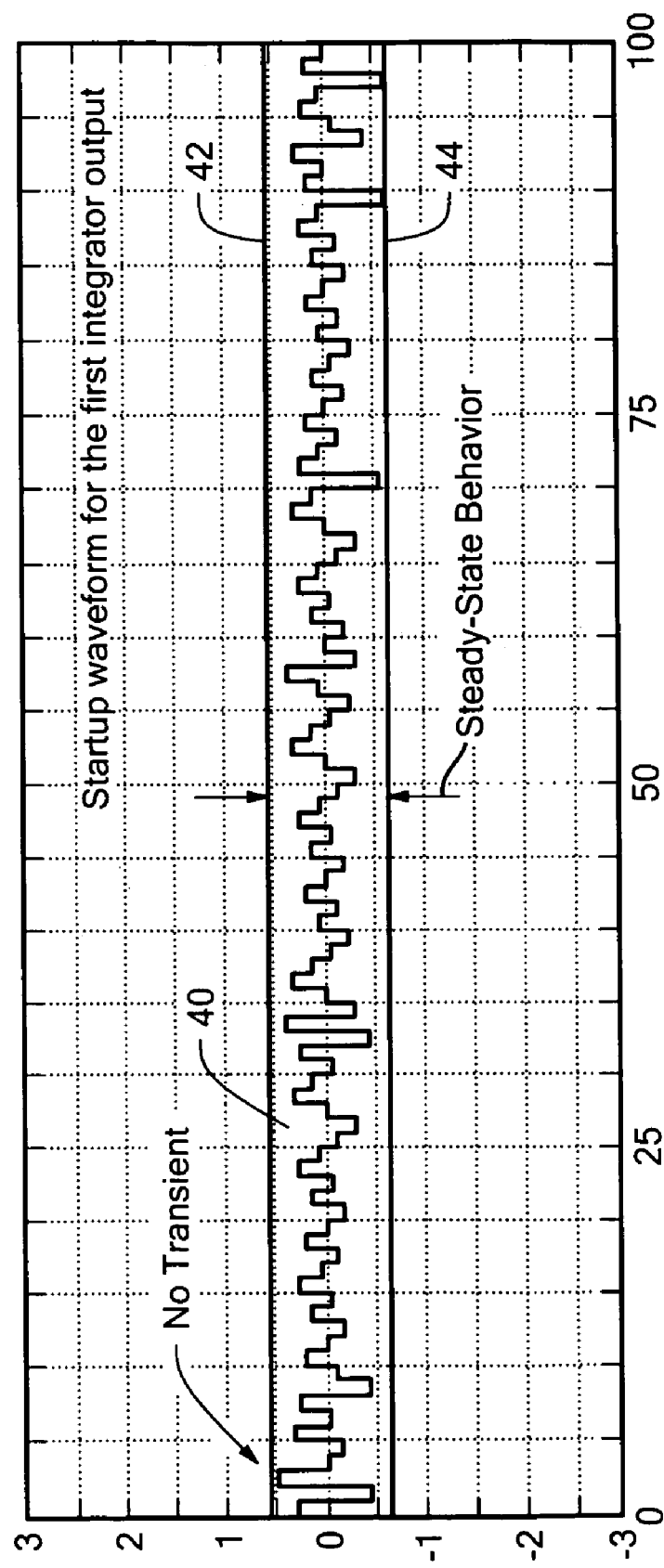
FIG. 4 is an illustration similar to FIG. 1 of a startup waveform for the improved ΔΣ modulator system with startup transient suppression of this invention.

In operation, control circuit 16 responds to a start/reset to set the internal states of loop filter 18 to zero, as is standard practice. At this time, control circuit 16 also operates envelope control circuit 14 which attenuates the input signal at 24 to ensure that it is small at the outset and then rises smoothly to its unattenuated value. The predetermined profile 30, FIG. 3, is a plot of the envelope factor versus the sample number or time. It shows that over a sample number of sixteen the envelope factor rises from almost 0 to a full 1.0. Now it can be seen, FIG. 4, that the start-up wave form 40 for the first integrator output remains wholly within the steady state behavior range 42, 44, and there are no transients that substantially exceed it initially or afterward. The profile in FIG. 3 is an example of a 16-sample envelope profile of a raised-cosine $env(t)=0.5(1-COS(\pi t/N))$. Thus, the input is initially strongly attenuated and then the attenuation decreases smoothly until the input is passed unattenuated at the $16^{th}$ sample. The steady state behavior range 42, 44 in FIG. 4 is referred to as the predetermined internal signal limits of the analog to digital converter and the attenuation affected by envelope control circuit 14 maintains the internal signal substantially within those predetermined limits as shown with respect to FIG. 4. Control circuit 16 operates envelope control circuit 14 for a limited time. For example the limited time, may be a fixed time such as the 16 sample times depicted in profile 30, FIG. 3, or the limited time may change depending upon some other parameters occurring in the system. In any case the attenuation is only applied for a finite period of time it is not continuous as in the case, for example, of automatic gain control circuits.

Figure 5:
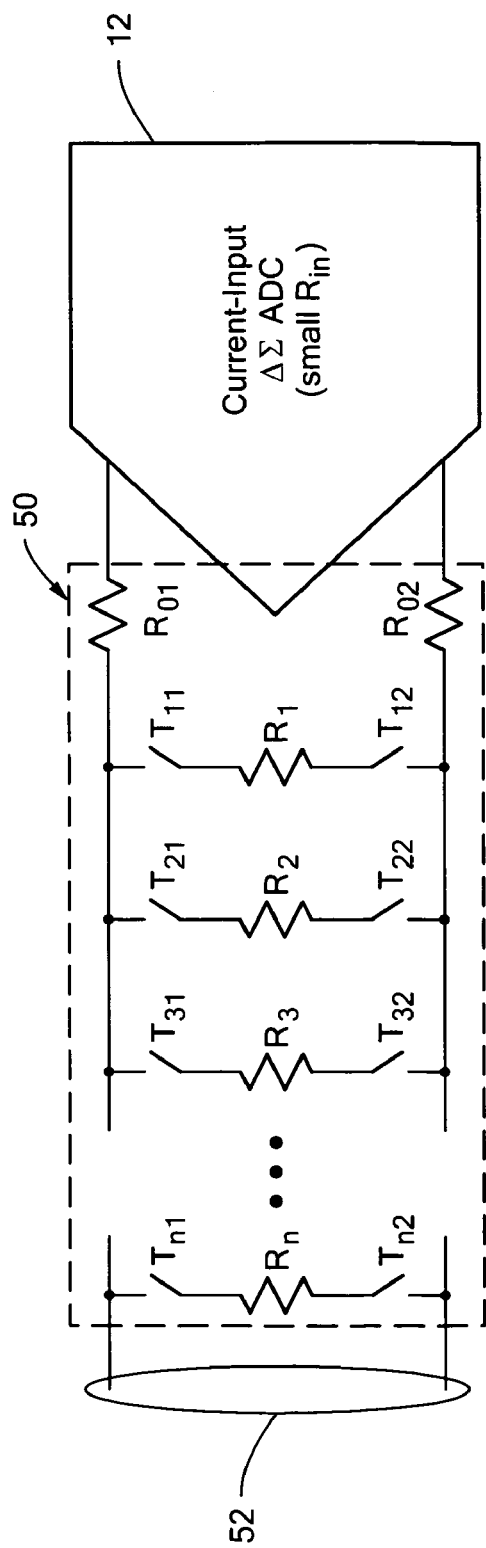
FIG. 5 is a more detailed schematic diagram of the envelope control circuit of FIG. 2.
Figure 6:
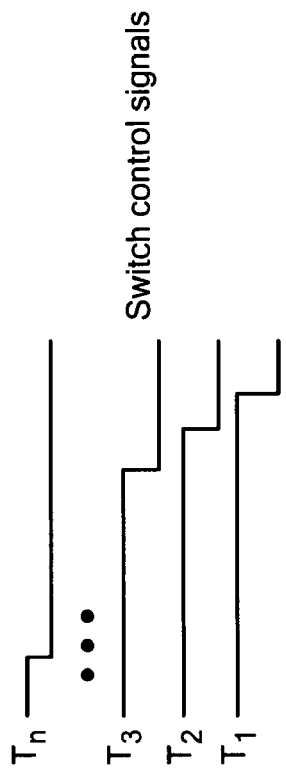
FIG. 6 illustrates the control signals for operating the switched resistors of FIG. 5.

Envelope control circuit 14 may be implemented with a programmable attenuator 50 FIG. 5 using, for example, a plurality of switched resistors $R_1, R_2, R_3 \ldots R_n$ which are selectively switched in and out of the input path 52 to analog to digital converter 12. Each resistor $R_1, R_2, R_3 \ldots R_n$ is accompanied by one or more switches $T_{11}, t_{12}, T_{21}, T_{22}, T_{31}, T_{32} \ldots T_{n1}, T_{n2}$ respectively, which are initially all in and are switched out one at a time, in this particular embodiment, to gradually reduce the attenuation from maximum to minimum. As can be seen in FIG. 6, each switch or pair of switches associated with resistances $R_1, R_2, R_3 \ldots R_n$ is operated by a switch control signal $T_1, T_2, T_3 \ldots T_n$ which are stepped so that resistor $R_n$ is switched out first then $R_{n-1}$, then $R_{n-2} \ldots$ and finally $R_1$. With n being equal to 16 the 16 steps in profile 30, FIG. 3, is obtained. Series resistors $R_{01}$ $R_{02}$ may be employed to overcome the shunting effect of analog to digital converter 12 itself when it is implemented using a current input analog to digital converter.

Figure 7:
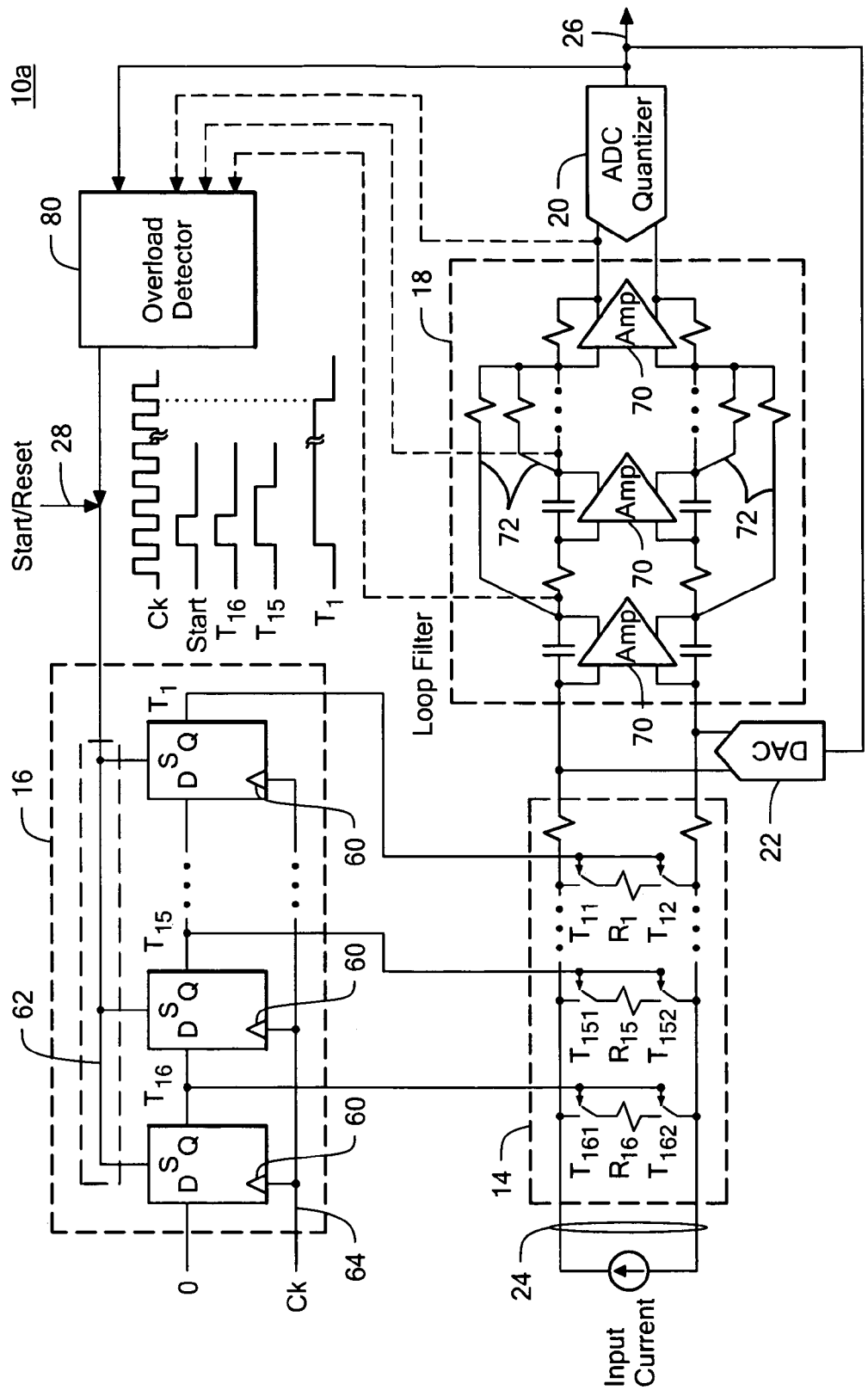
FIG. 7 is a view similar to FIG. 2 showing the control circuit and loop filter in more detail and an overload detector.

Control circuit 16, FIG. 7, may include a counter having a plurality of D flip-flops 60 which, upon the receipt of a start signal on line 62 from start/reset input 28 apply clock signals on line 64 to generate the timing signals $T_1$-$T_{16}$ to sequentially operate resistors $R_1$-$R_{16}$ in programmable attenuator 14. Loop filter 18 may be a conventional loop filter including a number of feedforward integrator stages 70 having feed forward paths 72. In one embodiment, control circuit 16 responds to enable envelope control circuit 14 not just in response to start/reset inputs 28 but also to a detection of an overload by overload detector 80, which simply detects the excursion of output 26, for example, beyond a predetermined limit. Overload detector 80 is not restricted to monitoring output 26; it may monitor the output of any one of the integrated stages 70.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A $\Delta\Sigma$ modulator system with startup transient suppression comprising
    a $\Delta\Sigma$ analog to digital converter having predetermined internal signal limits;
    an envelope control circuit for attenuating the input signal to said $\Delta\Sigma$ analog to digital converter; and
    a control circuit responsive to a start/reset signal to enable for a limited time said envelope control circuit to attenuate said input signal to maintain the $\Delta\Sigma$ analog to digital converter internal signal substantially within said predetermined internal signal limits.

2. The $\Delta\Sigma$ modulator system of claim 1 in which said envelope control circuit includes a programmable attenuator.

3. The $\Delta\Sigma$ modulator system of claim 2 in which said programmable attenuator includes a switched resistor network.

4. The ΔΣ modulator system of claim 3 in which said ΔΣ analog to digital converter is a current input analog to digital converter and said resistor network includes series input resistors interconnected to said analog to digital converter.

5. The ΔΣ modulator system of claim 1 in which said control circuit includes a counter for defining a limited time.

6. The ΔΣ modulator system of claim 1 further including an overload detector circuit for detecting an internal signal substantially beyond said predetermined internal signal limits to deliver a start/reset signal to said control circuit.

7. The ΔΣ modulator system of claim 1 in which said analog to digital converter includes a loop filter having a plurality of feedforward integrator stages.

8. The ΔΣ modulator system of claim 1 in which said envelope circuit attenuates the input signal along a predetermined profile.

9. The ΔΣ modulator system of claim 1 in which said limited time is a fixed limited time.

* * * * *